(12) United States Patent
Skogen et al.

(10) Patent No.: US 12,199,112 B1
(45) Date of Patent: Jan. 14, 2025

(54) EPITAXIALLY INTEGRATED PROTECTION DIODES FOR MONOCHROMATIC PHOTOSENSITIVE DIODES

(71) Applicant: National Technology & Engineering Solutions of Sandia, LLC, Albuquerque, NM (US)

(72) Inventors: Erik J. Skogen, Tijeras, NM (US); Gregory A. Vawter, Corrales, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 561 days.

(21) Appl. No.: 17/684,955

(22) Filed: Mar. 2, 2022

Related U.S. Application Data

(60) Provisional application No. 63/169,307, filed on Apr. 1, 2021.

(51) Int. Cl.
| | |
|---|---|
| H01L 27/14 | (2006.01) |
| H01L 25/065 | (2023.01) |
| H01L 27/142 | (2014.01) |
| H01L 27/144 | (2006.01) |
| H01L 23/00 | (2006.01) |

(52) U.S. Cl.
CPC ...... *H01L 27/1443* (2013.01); *H01L 25/0655* (2013.01); *H01L 27/1421* (2013.01); *H01L 24/48* (2013.01); *H01L 2224/4814* (2013.01)

(58) Field of Classification Search
CPC ............ H01L 27/1443; H01L 25/0655; H01L 27/1421; H01L 24/48; H01L 2224/4814
See application file for complete search history.

(56) References Cited

U.S. PATENT DOCUMENTS

| | | | | |
|---|---|---|---|---|
| 5,107,318 | A * | 4/1992 | Makiuchi | H01L 27/1443 257/E27.128 |
| 2007/0238208 | A1 * | 10/2007 | Nishida | H01S 5/04256 257/E27.12 |
| 2019/0181281 | A1 * | 6/2019 | Ritenour | H01L 31/1892 |
| 2023/0020718 | A1 * | 1/2023 | Weichmann | H01S 5/02461 |

* cited by examiner

Primary Examiner — Samuel Park
(74) Attorney, Agent, or Firm — Mark A. Dodd

(57) ABSTRACT

Monochromatic photosensitive devices (MPDs) having series connected photosensitive diode cell arrays in two configurations are disclosed. The MPDs employ a protection diode to bypass either one or multiple photosensitive diodes in each photosensitive diode cell should a photosensitive diode fail as an open circuit or become blocked from the monochromatic light. The protection diode is vertically (epitaxial growth direction) integrated with a photosensitive diode layer structure during epitaxial growth, thereby permitting monolithic fabrication of the one or multiple photosensitive diode cells. The bulk of the one or multiple photosensitive diodes are formed of a material having a bandgap corresponding to the wavelength of the monochromatic light, while the protection diodes are formed of a material having a bandgap greater than the wavelength of the monochromatic light. The monochromatic light passes through the protection diode before being absorbed by the one or multiple photosensitive diodes.

20 Claims, 2 Drawing Sheets

EPITAXIALLY INTEGRATED PROTECTION DIODES FOR MONOCHROMATIC PHOTOSENSITIVE DIODES

RELATED APPLICATIONS

This application claims priority to U.S. Provisional Application No. 63/169,307, filed on Apr. 1, 2021, and entitled EPITAXIALLY INTEGRATED PROTECTION DIODES FOR MONOCHROMATIC PHOTOSENSITIVE DIODES, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a protection diode for use in monochromatic photosensitive diodes, and in particular, to an epitaxially, i.e., vertically, integrated protection diode with minimal impact on fill-factor.

BACKGROUND

The conversion of monochromatic light into electrical power by monochromatic photosensitive diodes (MPDs) has attracted attention for various reasons. This power over fiber (POF) system typically contains (1) a light source, for example, a laser, (2) a transmission medium, for example, an optical fiber, and (3) an MPD. The typical POF process includes the following steps. First, the light source generates light energy and transmits it to the MPD via the transmission medium. Next, the MPD receives the light energy from the transmission medium and converts the optical energy into electrical energy.

This POF system may be used when electrical energy transmission using conductors is inconvenient, not recommended, or galvanic isolation between the load and power source is required. POF may provide the benefits of using optical fiber, for example, electrical isolation and light weight, as well as immunity from electro-magnetic, radio frequency (RF), and lightning interferences. POF may also offer improved safety relative to electricity energy transmission. POF systems may be used in numerous fields, including sensors, aerospace, energetic materials, high-voltage power lines, nuclear plants, measurement, and medical diagnostics.

POF systems are becoming more practical. Optical fibers have extremely low transmission losses for near-infrared (NIR) light (700-870 nm). Further, efficient high-power NIR laser sources are commercially available. As a result, typical POF systems use NIR lasers as light sources. The bandgap energy of the MPDs used in POF systems should be less than the photon energy of the received light. Thus, for NIR optical conversion, gallium arsenide (GaAs) p-n junction material is an obvious choice for the photosensitive diodes in MPDs.

The operating voltage of the MPDs is mainly determined by the bandgap of the active layer of the MPDs and the incident optical power. For a single junction GaAs-based MPD, the output voltage is approximately 1.0 V. However, most applications require a higher output voltage, for example, in the range of 5-12 V, to directly drive the associated electronic devices. There are several ways of achieving the higher required output voltage. The first approach is to use a single junction MPD with a DC-DC converter. However, the typical efficiency of a DC-DC converter is only 80% at best, which limits the practical application of this method.

The second approach to increasing the output voltage is to use an array of series connected individual photosensitive diode cells. However, one should incorporate separate protection diodes that can shunt current should one or more individual photosensitive diode cells fail in an electrically open condition. In like manner, these separate protection diodes can shunt current should light to one or more individual photosensitive diode cells be blocked. These protection diodes generally reside outside the array and must not be sensitive to the wavelength of the received light. In other approaches, the protection diodes can reside inside the main array, but are laterally offset from the active devices and thus the layout reduces the active device fill-factor.

In certain operating environments, POF systems may generate large current spikes or transients. For example, in an operating environment with high energy photon radiation, large current spikes may be generated when the MPD absorbs this high energy photon radiation. These current spikes may affect operation of components powered by the POF system.

Thus, the need exists for MPDs with vertically integrated protection diodes and high fill-factors. Further, the need exists for MPDs that can protect components powered by the MPDs in certain operating environments.

SUMMARY

One aspect of the present invention relates to vertical integration of the protection diodes usually found in MPDs having series connected photosensitive diode cell arrays into the epitaxial structure itself. The photosensitive diode cell with epitaxially integrated protection diode is a vertical (epitaxial growth direction) stack of two diodes. The first diode is the protection diode, which is not sensitive to the wavelength of the light source. The second diode is the main photosensitive diode, which is sensitive to the wavelength of the light source. Since the MPD is designed to operate under monochromatic illumination, the protection diode can be designed to be optically transparent to the wavelength of the light source. This can be done by designing the protection diode with a bandgap greater than the photon energy for light from the light source. For example, the photosensitive diode cell could be designed to absorb light having a wavelength of 800 nm using GaAs material as the absorption region while the protection diode could use aluminum gallium arsenide (AlGaAs) material, which has a larger bandgap than GaAs material. The received light would first pass through the high bandgap protection diode and then be absorbed in the lower bandgap photosensitive diode cell.

In at least one embodiment of the present invention, a monochromatic photosensitive device comprises a plurality of photosensitive diode cells, the plurality of photosensitive diode cells electrically connected in series, each of the plurality of photosensitive diode cells includes a photosensitive diode (the photosensitive diode formed of a narrower bandgap material and a wider bandgap material, a bandgap of the narrower bandgap material corresponding substantially to an energy of a photon of a substantially monochromatic light, a bandgap of the wider bandgap material being greater than the energy of a photon of the substantially monochromatic light) [the photosensitive diode includes a first layer of wider bandgap material having a first doping type, a second layer of nominally intrinsic narrower bandgap material (the second layer adjacent the first layer) and a third layer of narrower bandgap material having a second doping type different from the first doping type (the third layer adjacent the second layer) and a protection diode, the protection diode includes a fourth layer of wider bandgap material having the first doping type (the fourth layer adjacent the third layer), and a fifth layer of wider bandgap material having the second doping type (the fifth layer adjacent the fourth layer)], each of the plurality of photosensitive diode cells receiving the substantially monochromatic light on a corresponding protection diode, each of the corresponding protection diodes transmitting the substantially monochromatic light to a corresponding photosensitive diode, and each of the corresponding photosensitive diode absorbing the substantially monochromatic light.

In other monochromatic photosensitive device embodiments of the present invention, for each of the plurality of photosensitive diode cells, the first layer is electrically connected to the fifth layer with a metal trace or a bonding wire, for each of the plurality of photosensitive diode cells, the third layer is electrically connected to the fourth layer with a metal trace or a bonding wire, and the fourth layer of a first of the plurality of photosensitive diode cells is electrically connected to the fifth layer of a second of the plurality of photosensitive diode cells adjacent the first of the plurality of photosensitive diode cells with a metal trace or a bonding wire; each of the second layer and the third layer is formed of one of gallium arsenide (GaAs), indium gallium arsenide (InGaAs), or indium gallium arsenide phosphide (InGaAsP), and each of the first layer, the fourth layer, and the fifth layer is formed of one of aluminum gallium arsenide (AlGaAs), indium phosphide (InP), or indium gallium arsenide phosphide (InGaAsP); and each of the protection diodes transmitting substantially all of the substantially monochromatic light to a corresponding photosensitive diode.

In yet other monochromatic photosensitive device embodiments of the present invention, a lattice constant of each of the first layer, the second layer, the third layer, the fourth layer, and the fifth layer is substantially the same; a thickness of each of the first layer, the second layer, the third layer, the fourth layer, and the fifth layer is about 1.0 µm; a corresponding doping level of each of the first layer, the third layer, the fourth layer, and the fifth layer is between about $10^{17}$ cm$^{-3}$ and $10^{18}$ cm$^{-3}$; each photosensitive diode includes a reflective surface formed on the first layer on a first surface opposite the second layer, the reflective surface covering substantially all of the first surface, the reflective surface reflecting the substantially monochromatic light; the first surface of the first layer of each photosensitive diode includes a diffraction pattern formed therein, the diffraction pattern diffracting the substantially monochromatic light; and an absorption volume of each protection diode generating a high energy protection current in a high energy photon environment, an absorption volume of each photosensitive diode generating a high energy photocurrent in the high energy photon environment, and the high energy protection current is about equal to the high energy photocurrent.

In at least one embodiment of the present invention, a monochromatic photosensitive device comprises a plurality of photosensitive diode cells, the plurality of photosensitive diode cells electrically connected in series, each of the plurality of photosensitive diode cells includes a plurality of photosensitive diodes (the plurality of photosensitive diodes serially electrically connected, each of the plurality of photosensitive diodes formed of a narrower bandgap material and a wider bandgap material, a bandgap of the narrower bandgap material corresponding substantially to an energy of a photon of a substantially monochromatic light, a bandgap of the wider bandgap material being greater than the energy of a photon of the substantially monochromatic light) [each of the photosensitive diodes includes a first layer of wider bandgap material having a first doping type, a second layer of nominally intrinsic narrower bandgap material (the second layer adjacent the first layer), and a third layer of narrower bandgap material having a second doping type different from the first doping type (the third layer adjacent the second layer) and a protection diode, the protection diode includes a fourth layer of wider bandgap material having the first doping type (the fourth layer adjacent the third layer), and a fifth layer of wider bandgap material having the second doping type (the fifth layer adjacent the fourth layer)], each of the plurality of photosensitive diode cells receiving the substantially monochromatic light on a corresponding protection diode, each of the corresponding protection diodes transmitting the substantially monochromatic light to a corresponding plurality of photosensitive diodes, and each of the corresponding plurality of photosensitive diodes absorbing the substantially monochromatic light.

In other monochromatic photosensitive device embodiments of the present invention, for each of the plurality of photosensitive diode cells, the first layer of a first of the plurality of photosensitive diodes is electrically connected to the fifth layer of the first of the plurality of photosensitive diodes with a metal trace or a bonding wire, for each of the plurality of photosensitive diode cells, the third layer of the first of the plurality of photosensitive diode is electrically connected to the first layer of a second of the plurality of photosensitive diodes adjacent the first of the plurality of photosensitive diodes with a metal trace or a bonding wire, for each of the plurality of photosensitive diode cells, the third layer of the second of the plurality of photosensitive diodes is electrically connected to the fourth layer of the second of the plurality of photosensitive diodes with a metal trace or a bonding wire, and the fourth layer of a first of the plurality of photosensitive diode cells is electrically connected to the fifth layer of a second of the plurality of photosensitive diode cells adjacent the first of the plurality of photosensitive diode cells with a metal trace or a bonding wire.

In yet other monochromatic photosensitive device embodiments of the present invention, each of the second layer and the third layer is formed of one of gallium arsenide (GaAs), indium gallium arsenide (InGaAs), or indium gallium arsenide phosphide (InGaAsP), and each of the first layer, the fourth layer, and the fifth layer is formed of one of aluminum gallium arsenide (AlGaAs), indium phosphide (InP), or indium gallium arsenide phosphide (InGaAsP); each of the protection diodes transmitting substantially all of the substantially monochromatic light to a corresponding plurality of photosensitive diodes; a lattice constant of each of the first layer, the second layer, the third layer, the fourth layer, and the fifth layer is substantially the same; a thickness of each of the first layer, the second layer, the third layer, the fourth layer, and the fifth layer is about 1.0 µm; and a corresponding doping level of each of the first layer, the third layer, the fourth layer, and the fifth layer is between about $10^{17}$ cm$^{-3}$ and $10^{18}$ cm$^{-3}$.

In yet other monochromatic photosensitive device embodiments of the present invention, each photosensitive diode includes a reflective surface formed on the first layer on a first surface opposite the second layer, the reflective surface covering substantially all of the first surface, the reflective surface reflecting the substantially monochromatic light; the first surface of the first layer of each photosensitive diode includes a diffraction pattern formed therein, the diffraction pattern diffracting the substantially monochromatic light; and an absorption volume of each protection diode generating a high energy protection current in a high energy photon environment, an absorption volume of each plurality of photosensitive diodes generating a high energy photocurrent in the high energy photon environment, and the high energy protection current is about equal to the high energy photocurrent.

Features from any of the disclosed embodiments may be used in combination with one another, without limitation. In addition, other features and advantages of the present disclosure will become apparent to those of ordinary skill in the art through consideration of the following detailed description and the accompanying drawings.

As used herein, the term "about" means+/−20% of any recited value. As used herein, this term modifies any recited value, range of values, or endpoints of one or more ranges.

As used herein, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
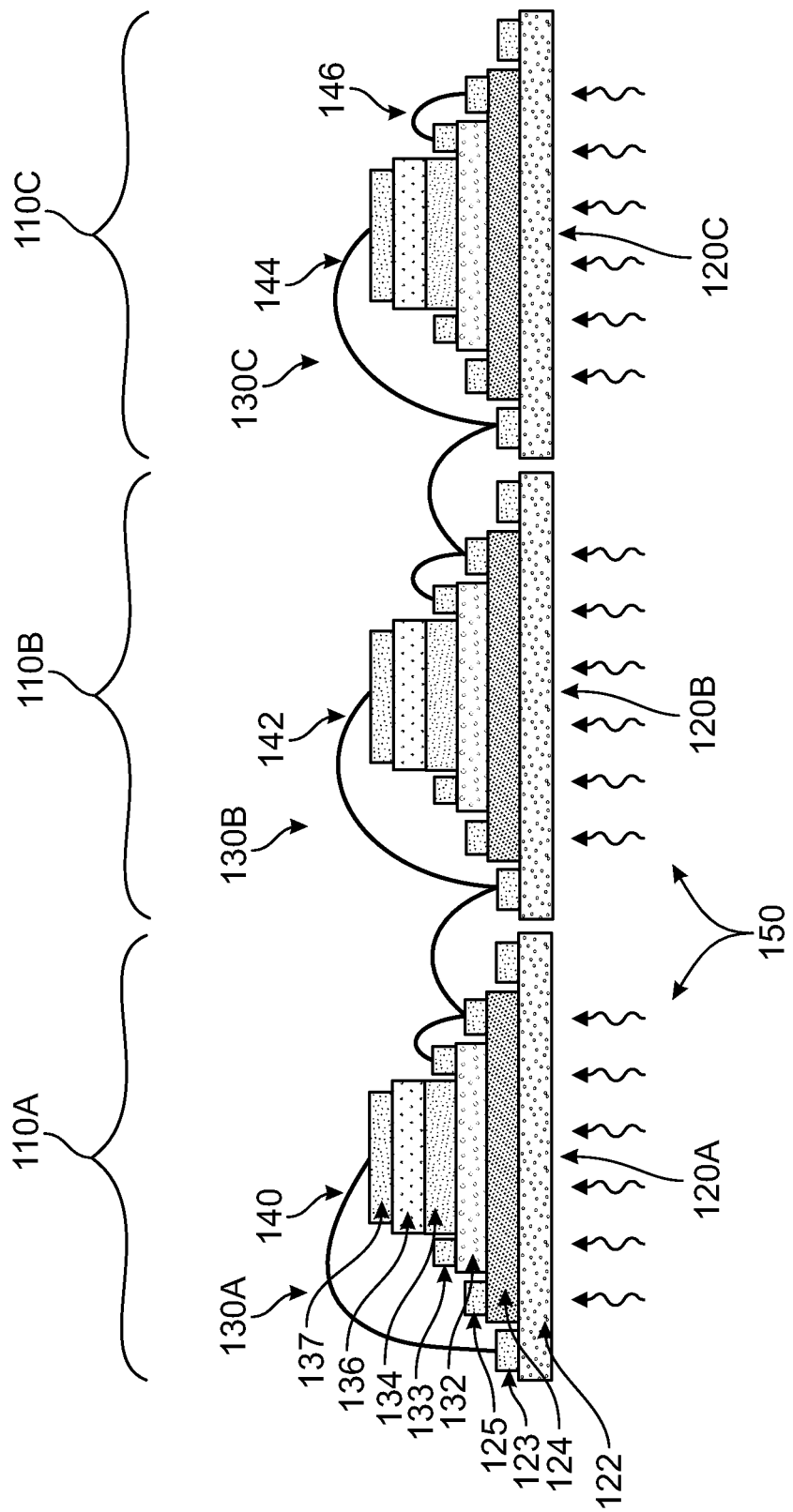
FIG. 1 illustrates a side view of a monochromatic photovoltaic device (MPD) in accordance with one or more embodiments of the present invention.

FIG. 1 illustrates a monochromatic photosensitive diode (MPD) cell array 100 in accordance with one or more embodiments of the present invention. The MPD cell array 100 includes three photosensitive diode cells 110A, 110B, 110C connected in series. While not illustrated, the three photosensitive diode cells 110A, 110B, 110C preferably share a common substrate. Each of the three photosensitive diode cells 110A, 110B, 110C includes a protection diode 120A, 120B, 120C, and a photosensitive diode 130A, 130B, 130C. Each protection diode 120A, 120B, 120C includes a wider bandgap n-type layer 122, with a protection diode n-type contact 123, and a wider bandgap p-type layer 124, with a protection diode p-type contact 125. Each photosensitive diode 130A, 130B, 130C includes a narrower bandgap n-type layer 132, with a photosensitive diode n-type contact 133, a narrower bandgap intrinsic layer 134, and a wider bandgap p-type layer 136, with a photosensitive diode p-type contact 137.

In other embodiments of the present invention, the doping types are reversed. For example, wider bandgap layer 122 would be doped p-type, while wider bandgap layer 124 would be doped n-type, etc. While the illustrated photosensitive diodes 130A, 130B, 130C are photovoltaic diodes, which typically operate at approximately direct current (DC), other embodiments of the present invention may employ photosensitive diodes that are photodiodes, which typically operate at higher frequencies in response to modulated light. Thus, the term "photosensitive diode" is generic and includes both "photovoltaic diodes" and "photodiodes."

The three photosensitive diodes 110A, 110B, 110C are electrically interconnected using electrical interconnects, for example, bonding wires. A first bonding wire 140 electrically connects the protection diode n-type contact 123 and the photosensitive diode p-type contact 137. A second bonding wire 142 electrically connects the photosensitive diode n-type contact 133 and the protection diode p-type contact 125 of the first photosensitive diode 110A to the protection diode n-type contact 123 and the photosensitive diode p-type contact 137 of the second photosensitive diode 110B. A third bonding wire 144 electrically connects the photosensitive diode n-type contact 133 and the protection diode p-type contact 125 of the second photosensitive diode 110B to the protection diode n-type contact 123 and the photosensitive diode p-type contact 137 of the third photosensitive diode 110C. A fourth bonding wire 146 electrically connects the photosensitive diode n-type contact 133 and the protection diode p-type contact 125 of the third photosensitive diode 110C. The MPD cell array 100 is electrically connected to an external device via the protection diode n-type contact 123 (or the electrically connected photodiode p-type contact 137) of the first photosensitive diode 110A, and the photodiode n-type contact 133 (or the electrically connected protection diode p-type contact 125) of the third photosensitive diode 110C.

During operation, light 150 is incident on the MPD cell array 100 from the protection diode 120A, 120B, 120C side of the MPD cell array 100. The light 150 passes through the protection diodes 120A, 120B, 120C and into the photosensitive diodes 130A, 130B, 130C, with the narrower bandgap intrinsic layer 134 absorbing most of the light 150. Because the photosensitive diodes 130A, 130B, 130C are vertically stacked on corresponding protection diodes 120A, 120B, 120C, the inclusion of the protection diodes 120A, 120B, 120C results in a limited reduction in the fill-factor of the MPD cell array 100. As the light source (not illustrated) may, for example, be a laser, the light 150 consists essentially of monochromatic light given the essentially monochromatic nature of laser light.

In one or more embodiments of the present invention, the photosensitive diode p-type contact 137 covers substantially all of the top surface of the wider bandgap p-type layer 136. Any light 150 not absorbed during its initial pass through the narrower bandgap intrinsic layer 134 is reflected by the photosensitive diode p-type contact 137 and absorbed during its second pass through the narrower bandgap intrinsic layer 134. The length of the absorption path is effectively twice the thickness of the narrower bandgap intrinsic layer 134. In this manner, the photosensitive diode p-type contact 137 becomes a reflective surface.

In one or more embodiments of the present invention, a top surface of the wider bandgap p-type layer 136 includes a diffraction pattern formed therein and the photosensitive diode p-type contact 137 covers substantially all of the top surface of the wider bandgap p-type layer 136. Any light 150 not absorbed during its initial pass through the narrower bandgap intrinsic layer 134 is diffracted by the diffraction pattern in the top surface of the wider bandgap p-type layer 136 and reflected by the photosensitive diode p-type contact 137. This diffracted and reflected light 150 will be absorbed during its second pass through the narrower bandgap intrinsic layer 134, which will effectively appear thicker due to a diffraction angle of the light 150. Thus, the length of the absorption path is effectively more than twice the thickness of the narrower bandgap intrinsic layer 134.

Should one of the photosensitive diodes 130A, 130B, 130C fail as an electrical open circuit or become blocked from the incident light 150, the MPD cell array 100 can remain useful as the output voltage of the overall MPD cell array 100 will drop by only the voltage of a single photosensitive diode 130 (not including the forward voltage of the corresponding protection diode 120). This embodiment of the present invention is therefore robust with respect to the failure or optical blockage of a single photosensitive diode 130 within the string of photosensitive diodes 130A, 130B, 130C.

As the MPD cell array 100 is designed to operate under monochromatic illumination, the protection diodes 120A, 120B, 120C can be designed to be optically transparent to the wavelength of the light 150. This can be done by designing the protection diodes 120A, 120B, 120C with a bandgap greater than the photon energy of the light 150. For example, the photosensitive diodes 130A, 130B, 130C could be designed to absorb light having a wavelength of 800 nm in the near infrared (NIR). In this case, the narrower bandgap n-type layer 132 and the narrower bandgap intrinsic layer 134 may employ gallium arsenide (GaAs) material, which has a bandgap corresponding substantially to the energy of a photon having a wavelength of 800 nm. Conversely, the wider bandgap n-type layer 122, the wider bandgap p-type layer 124, and the wider bandgap p-type layer 136 may employ aluminum gallium arsenide (AlGaAs) material, which has a larger bandgap than GaAs material. The primary requirement regarding the composition of the wider bandgap layers is that it transmits substantially all of the light 150 to the photosensitive diode 130A, 130B, 130C.

While the MPD cell array 100 just described employed AlGaAs material for the protection diodes 120A, 120B, 120C and GaAs material for the bulk of the photosensitive diodes 130A, 130B, 130C, any suitable composition may be used in other embodiments. For example, in other embodiments of the present invention, if the MPD cell array 100 is designed to operate with light 150 in the short wavelength infrared (SWIR) range, indium phosphide (InP) material may be employed for the protection diodes 120A, 120B, 120C and indium gallium arsenide (InGaAs) material for the bulk of the photosensitive diodes 130A, 130B, 130C. In still other embodiments of the present invention, two different compositions of indium gallium arsenide phosphide (InGaAsP) having wider and narrower bandgaps may be used for the protection diodes 120A, 120B, 120C and the bulk of the photosensitive diodes 130A, 130B, 130C, respectively. It is preferred that the lattice constant for the narrower bandgap layers be substantially the same as the lattice constant for the wider bandgap layers as lattice mismatch may introduce defects that may lower the conversion efficiency of the photosensitive diodes 130A, 130B, 130C or result in increased leakage current. To further ensure that light 150 is not absorbed by the protection diodes 120A, 120B, 120C, the wider bandgap layers may be formed of an indirect bandgap material in some embodiments of the present invention. For example, the wider bandgap layers may be formed of $Al_xGa_{1-x}As$ having an aluminum content x of 0.45 or greater.

The various layers of the MPD cell array 100 may be deposited by any suitable process. For example, the wider bandgap n-type layer 122, the wider bandgap p-type layer 124, the narrower bandgap n-type layer 132, the narrower bandgap intrinsic layer 134, and the wider bandgap p-type layer 136 may be deposited using an epitaxial chemical vapor deposition (CVD) process or a molecular beam epitaxy (MBE) process.

The various layers of the MPD cell array 100 may be doped at any suitable level. Requirements for the doping levels in the wider bandgap n-type layer 122, the wider bandgap p-type layer 124, the narrower bandgap n-type layer 132, and the wider bandgap p-type layer 136 include that they form low resistance ohmic contacts with the protection diode n-type contacts 123, the protection diode p-type contacts 125, the photosensitive diode n-type contacts 133, and the photosensitive diode p-type contacts 137. For the MPD cell array 100 employing AlGaAs and GaAs material, the doping levels for the wider bandgap n-type layer 122, the wider bandgap p-type layer 124, the narrower bandgap n-type layer 132, and the wider bandgap p-type layer 136, may, for example, be about $10^{17}$ to $10^{18}$ $cm^{-3}$ for each of the layers, and preferably approximately $8 \times 10^{17}$ $cm^{-3}$. The narrower bandgap intrinsic layer 134 is nominally intrinsic, i.e., preferably not intentionally doped, but may have an unintentional, i.e., background, doping level of, for example, about $10^{15}$ $cm^{-3}$ or less.

The various layers of the MPD cell array 100 may have any suitable thickness. Requirements for the thicknesses of the wider bandgap n-type layer 122, the wider bandgap p-type layer 124, the narrower bandgap n-type layer 132, and the wider bandgap p-type layer 136 include that they be thick enough to form low resistance ohmic contacts with the protection diode n-type contacts 123, the protection diode p-type contacts 125, the photosensitive diode n-type contacts 133, and the photosensitive diode p-type contacts 137. One additional requirement for the narrower bandgap intrinsic layer 134 is that it be thick enough to absorb most of the incident light 150. For the MPD cell array 100 employing AlGaAs and GaAs material, the thicknesses for the wider bandgap n-type layer 122, the wider bandgap p-type layer 124, the narrower bandgap n-type layer 132, the narrower bandgap intrinsic layer 134, and the wider bandgap p-type layer 136, may, for example, be about 1.0 µm for each of the layers.

The protection diode n-type contacts 123, the protection diode p-type contacts 125, the photosensitive diode n-type contacts 133, and the photosensitive diode p-type contacts 137, i.e., the metal contacts, may have any suitable composition(s) and thickness(es). For example, the protection diode n-type contacts 123 and the photosensitive diode n-type contacts 133 may employ a Ge/Au/Ni/Au multi-layer structure with thicknesses of 26 nm, 54 nm, 15 nm, and 200 nm, respectively. As a further example, the protection diode p-type contacts 125 and the photosensitive diode p-type contacts 137 may employ a AuBe/Ni/Au multi-layer structure with thicknesses of 30 nm, 15 nm, and 200 nm, respectively. The metal contacts are preferably reflective at the wavelength of the light 150. By being reflective at this wavelength, this will reduce optical absorption in the metal contacts, thereby reducing heating of the metal contacts.

Bonding of the first, second, third, and fourth bonding wires 140, 142, 144, 146 may be made by any suitable process. Exemplary bonding processes include thermocompression, ultrasonic, and thermosonic processes, which can be used to produce ball bonds (thermocompression and thermosonic processes) or wedge bonds (ultrasonic and thermosonic processes).

While FIG. 1 illustrates three photosensitive diode cells 110A, 110B, 110C connected in series, other embodiments of the present invention may include more or less than three photosensitive diode cells connected in series, with the number of photosensitive diode cells typical determined by the desired output voltage of the MPD cell array for a given application.

While FIG. 1 illustrates the use of first, second, third, and fourth bonding wires 140, 142, 144, 146, other embodiments of the present invention may employ metal traces formed on the surface of the MPD cell array 100.

Figure 2:
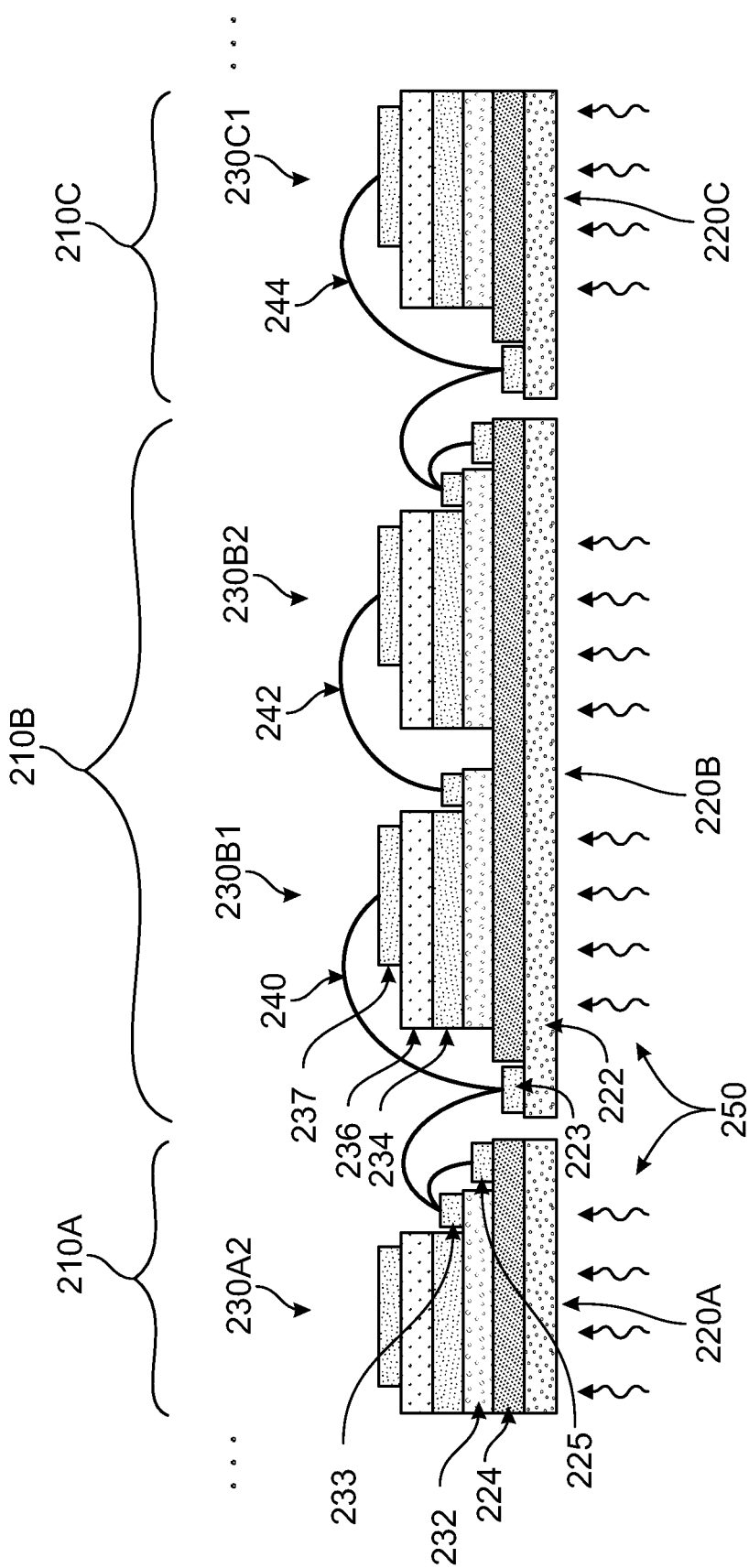
FIG. 2 illustrates a side view of a monochromatic photovoltaic device (MPD) in accordance with one or more embodiments of the present invention.

FIG. 2 illustrates a monochromatic photosensitive diode (MPD) cell array 200 in accordance with one or more embodiments of the present invention. The MPD cell array 200 includes at least three photosensitive diode cells 210A, 210B, 210C connected in series, with only photosensitive diode cell 210B fully illustrated. While not illustrated, the three photosensitive diode cells 210A, 210B, 210C preferably share a common substrate. Each of the three photosensitive diode cells 210A, 210B, 210C includes a protection diode 220A, 220B, 220C, and a pair of series connected photosensitive diodes 230A2, 230B1, 230B2, 230C1. Each protection diode 220A, 220B, 220C includes a wider bandgap n-type layer 222, with a protection diode n-type contact 223, and a wider bandgap p-type layer 224, with a protection diode p-type contact 225. Each pair of photosensitive diodes 230A2, 230B1, 230B2, 230C1 includes a narrower bandgap n-type layer 232, with a photosensitive diode n-type contact 233, a narrower bandgap intrinsic layer 234, and a wider bandgap p-type layer 236, with a photosensitive diode p-type contact 237.

The three photosensitive diode cells 210A, 210B, 210C are electrically interconnected using electrical interconnects, for example, bonding wires. A first bonding wire 240 electrically connects the photosensitive diode n-type contact 233 and the protection diode p-type contact 225 of photosensitive diode 230A2 to the protection diode n-type contact 223 and the photosensitive diode p-type contact 237 of photosensitive diode 230B1. A second bonding wire 242 electrically connects the photosensitive diode n-type contact 233 of photosensitive diode 230B1 to the photosensitive diode p-type contact 237 of photosensitive diode 230B2. A third bonding wire 244 electrically connects the photosensitive diode n-type contact 233 and the protection diode p-type contact 225 of photosensitive diode 230B2 to the protection diode n-type contact 223 and the photosensitive diode p-type contact 237 of photosensitive diode 230C1. The MPD cell array 200 is electrically connected to an external device via the protection diode n-type contact 223 of the first photosensitive diode (not illustrated) of photosensitive diode cell 210A and the protection diode p-type contact 225 of the second photosensitive diode (not illustrated) of the photosensitive diode cell 210C.

The various guidelines for the layer materials and compositions, the layer deposition process, the layer doping levels, layer thicknesses, wire bonding process, and metal trace alternatives for the MPD cell array 100 discussed above with reference to FIG. 1 also apply to the MPD cell array 200 illustrated in FIG. 2.

While FIG. 2 illustrates three photosensitive diode cells 210A, 210B, 210C connected in series, other embodiments of the present invention may include more or less than three photosensitive diode cells connected in series, with the number of photosensitive diode cells typical determined by the desired output voltage of the MPD cell array for a given application. Further, while FIG. 2 illustrates two photosensitive diodes, for example, the photosensitive diodes 230B1, 230B2, protected by a single protection diode, for example, protection diode 220B, other embodiments of the present invention may include more than two photosensitive diodes protected by a single protection diode, thereby further increasing the fill-factor of the MPD cell array.

The design of the MPD cell array 200 illustrated in FIG. 2 offers at least one advantage and one disadvantage relative to the design of the MPD cell array 100 illustrated in FIG. 1. At least one advantage of the design of the MPD cell array 200 over the design of the MPD cell array 100 is that a single protection diode protects multiple photosensitive diodes. Because a single protection diode protects multiple photosensitive diodes, for example, the protection diode 220B protects the photosensitive diodes 230B1, 230B2, the area of the protection diode n-type and p-type contacts 223, 225 for the photosensitive diode cell 210B is shared across multiple photosensitive diodes 230B1, 230B2. In contrast, a single protection diode protects a single photosensitive diode in the design of MPD cell array 100. Because a single protection diode protects only a single photosensitive diode, for example, the protection diode 120B protects the photosensitive diode 130B, the area of the protection diode n-type and p-type contacts 123, 125 of the protection diode 120B is shared across just a single photosensitive diode 130B. Thus, the fill-factor for the design of the MPD cell array 200 illustrated in FIG. 2 should be greater than the fill-factor for the design of the MPD cell array 100 illustrated in FIG. 1.

At least one disadvantage of the design of the MPD cell array 200 over the design of the MPD cell array 100 is that should one of the photosensitive diodes 230A2, 230B1, 230B2, 230C1 fail as an electrical open circuit or become blocked from the incident light 250, the MPD cell array 200 can remain useful, but the output voltage of the overall MPD cell array 200 will drop by twice the voltage of a single photosensitive diode 230 (or the sum of however many series connected photosensitive diodes 230 are protected by a single protection diode 220), not including the forward voltage of the corresponding protection diode 220. Thus, the output voltage for the design of the MPD cell array 200 illustrated in FIG. 2 will be less than the output voltage for the design of the MPD cell array 100 illustrated in FIG. 1 should a photosensitive diode fail. This output voltage drop for the design of the MPD cell array 200 illustrated in FIG. 2 will be even more severe when one protection diode protects more than two series connected photosensitive diodes. Thus, the number of series connected photosensitive diodes protected by a single protection diode is preferably determined by the maximum acceptable output voltage drop.

In certain applications, an MPD cell array may be operating in an environment with high energy photon radiation, the high energy photons separate and apart from the substantially monochromatic light. These high energy photons may, for example, have an energy greater than about 100 eV. In such environments, the protection diodes may serve an additional purpose. Specifically, the protection diodes may inhibit or at least reduce current spikes, due to pulses of high energy photon radiation, from affecting operation of components powered by the MPD cell array. When operating in these high energy photon radiation environments, it is preferable that the current created in the protection diode, i.e., the high energy protection current, be equal to the current created in the corresponding photosensitive diode(s), i.e., the high energy photocurrent, so that the two currents may cancel each other. This may be done, for example, by designing the MPD cell array such that the absorption volume for the protection diode is the same as the absorption volume for the corresponding photosensitive diode(s). To this end, the thicknesses of the various layers may be adjusted and/or the areas of the protection diode and the corresponding photosensitive diode(s) may be adjusted.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A monochromatic photosensitive device comprising:
 a plurality of photosensitive diode cells, the plurality of photosensitive diode cells electrically connected in series, each of the plurality of photosensitive diode cells including:
  a photosensitive diode, the photosensitive diode formed of a narrower bandgap material and a wider bandgap material, a bandgap of the narrower bandgap material corresponding substantially to an energy of a photon of a substantially monochromatic light, a bandgap of the wider bandgap material being greater than the energy of a photon of the substantially monochromatic light, the photosensitive diode including:
   a first layer of wider bandgap material having a first doping type;
   a second layer of nominally intrinsic narrower bandgap material, the second layer adjacent the first layer; and
   a third layer of narrower bandgap material having a second doping type different from the first doping type, the third layer adjacent the second layer; and
  a protection diode, the protection diode including:
   a fourth layer of wider bandgap material having the first doping type, the fourth layer adjacent the third layer; and
   a fifth layer of wider bandgap material having the second doping type, the fifth layer adjacent the fourth layer;
 wherein each of the plurality of photosensitive diode cells is adapted to receive the substantially monochromatic light on a corresponding protection diode, each of the corresponding protection diodes is adapted to transmit the substantially monochromatic light to a corresponding photosensitive diode, and each of the corresponding photosensitive diode is adapted to absorb the substantially monochromatic light.

2. The monochromatic photosensitive device of claim 1, wherein, for each of the plurality of photosensitive diode cells, the first layer is electrically connected to the fifth layer with a metal trace or a bonding wire;
 wherein, for each of the plurality of photosensitive diode cells, the third layer is electrically connected to the fourth layer with a metal trace or a bonding wire; and
 wherein the fourth layer of a first of the plurality of photosensitive diode cells is electrically connected to the fifth layer of a second of the plurality of photosensitive diode cells adjacent the first of the plurality of photosensitive diode cells with a metal trace or a bonding wire.

3. The monochromatic photosensitive device of claim 1, wherein each of the second layer and the third layer is formed of one of gallium arsenide (GaAs), indium gallium arsenide (InGaAs), or indium gallium arsenide phosphide (InGaAsP); and
 wherein each of the first layer, the fourth layer, and the fifth layer is formed of one of aluminum gallium arsenide (AlGaAs), indium phosphide (InP), or indium gallium arsenide phosphide (InGaAsP).

4. The monochromatic photosensitive device of claim 1, wherein each of the protection diodes is adapted to transmit substantially all of the substantially monochromatic light to a corresponding photosensitive diode.

5. The monochromatic photosensitive device of claim 1, wherein a lattice constant of each of the first layer, the second layer, the third layer, the fourth layer, and the fifth layer are substantially the same.

6. The monochromatic photosensitive device of claim 1, wherein a thickness of each of the first layer, the second layer, the third layer, the fourth layer, and the fifth layer are about 1.0 µm.

7. The monochromatic photosensitive device of claim 1, wherein a corresponding doping level of each of the first layer, the third layer, the fourth layer, and the fifth layer are between about $10^{17}$ cm$^{-3}$ and $10^{18}$ cm$^{-3}$.

8. The monochromatic photosensitive device of claim 1, wherein each photosensitive diode includes a reflective surface formed on the first layer on a first surface opposite the second layer, the reflective surface covering substantially all of the first surface, the reflective surface adapted to reflect the substantially monochromatic light.

9. The monochromatic photosensitive device of claim 8, wherein the first surface of the first layer of each photosensitive diode includes a diffraction pattern formed therein, the diffraction pattern adapted to diffract the substantially monochromatic light.

10. The monochromatic photosensitive device of claim 1, wherein an absorption volume of each protection diode is adapted to generate a high energy protection current in a high energy photon environment;
 wherein an absorption volume of each photosensitive diode is adapted to generate a high energy photocurrent in the high energy photon environment; and
 wherein the high energy protection current is about equal to the high energy photocurrent.

11. A monochromatic photosensitive device comprising:
 a plurality of photosensitive diode cells, the plurality of photosensitive diode cells electrically connected in series, each of the plurality of photosensitive diode cells including:
  a plurality of photosensitive diodes, the plurality of photosensitive diodes serially electrically connected, each of the plurality of photosensitive diodes formed of a narrower bandgap material and a wider bandgap material, a bandgap of the narrower bandgap material corresponding substantially to an energy of a photon of a substantially monochromatic light, a bandgap of the wider bandgap material being greater than the energy of a photon of the substantially monochromatic light, each of the photosensitive diodes including:
   a first layer of wider bandgap material having a first doping type;
   a second layer of nominally intrinsic narrower bandgap material, the second layer adjacent the first layer; and a third layer of narrower bandgap material having a second doping type different from the first doping type, the third layer adjacent the second layer; and a protection diode, the protection diode including:

a fourth layer of wider bandgap material having the first doping type, the fourth layer adjacent the third layer; and a fifth layer of wider bandgap material having the second doping type, the fifth layer adjacent the fourth layer;

wherein each of the plurality of photosensitive diode cells is adapted to receive the substantially monochromatic light on a corresponding protection diode, each of the corresponding protection diodes is adapted to transmit the substantially monochromatic light to a corresponding plurality of photosensitive diodes, and each of the corresponding plurality of photosensitive diodes is adapted to absorb the substantially monochromatic light.

12. The monochromatic photosensitive device of claim 11, wherein, for each of the plurality of photosensitive diode cells, the first layer of a first of the plurality of photosensitive diodes is electrically connected to the fifth layer of the first of the plurality of photosensitive diodes with a metal trace or a bonding wire;

wherein, for each of the plurality of photosensitive diode cells, the third layer of the first of the plurality of photosensitive diode is electrically connected to the first layer of a second of the plurality of photosensitive diodes adjacent the first of the plurality of photosensitive diodes with a metal trace or a bonding wire;

wherein, for each of the plurality of photosensitive diode cells, the third layer of the second of the plurality of photosensitive diodes is electrically connected to the fourth layer of the second of the plurality of photosensitive diodes with a metal trace or a bonding wire; and wherein the fourth layer of a first of the plurality of photosensitive diode cells is electrically connected to the fifth layer of a second of the plurality of photosensitive diode cells adjacent the first of the plurality of photosensitive diode cells with a metal trace or a bonding wire.

13. The monochromatic photosensitive device of claim 11, wherein each of the second layer and the third layer is formed of one of gallium arsenide (GaAs), indium gallium arsenide (InGaAs), or indium gallium arsenide phosphide (InGaAsP); and wherein each of the first layer, the fourth layer, and the fifth layer is formed of one of aluminum gallium arsenide (AlGaAs), indium phosphide (InP), or indium gallium arsenide phosphide (InGaAsP).

14. The monochromatic photosensitive device of claim 11, wherein each of the protection diodes is adapted to transmit substantially all of the substantially monochromatic light to a corresponding plurality of photosensitive diodes.

15. The monochromatic photosensitive device of claim 11, wherein a lattice constant of each of the first layer, the second layer, the third layer, the fourth layer, and the fifth layer are substantially the same.

16. The monochromatic photosensitive device of claim 11, wherein a thickness of each of the first layer, the second layer, the third layer, the fourth layer, and the fifth layer are about 1.0 µm.

17. The monochromatic photosensitive device of claim 11, wherein a corresponding doping level of each of the first layer, the third layer, the fourth layer, and the fifth layer are between about $10^{17}$ cm$^{-3}$ and $10^{18}$ cm$^{-3}$.

18. The monochromatic photosensitive device of claim 11, wherein each photosensitive diode includes a reflective surface formed on the first layer on a first surface opposite the second layer, the reflective surface covering substantially all of the first surface, the reflective surface adapted to reflect the substantially monochromatic light.

19. The monochromatic photosensitive device of claim 18, wherein the first surface of the first layer of each photosensitive diode includes a diffraction pattern formed therein, the diffraction pattern adapted to diffract the substantially monochromatic light.

20. The monochromatic photosensitive device of claim 11, wherein an absorption volume of each protection diode is adapted to generate a high energy protection current in a high energy photon environment;

wherein an absorption volume of each plurality of photosensitive diodes is adapted to generate a high energy photocurrent in the high energy photon environment; and wherein the high energy protection current is about equal to the high energy photocurrent.

* * * * *